United States Patent
Sorensen et al.

(10) Patent No.: US 8,691,047 B2
(45) Date of Patent: Apr. 8, 2014

(54) LARGE AREA PLASMA PROCESSING CHAMBER WITH AT-ELECTRODE RF MATCHING

(75) Inventors: Carl A. Sorensen, Morgan Hill, CA (US); John M. White, Hayward, CA (US); Jozef Kudela, Sunnyvale, CA (US)

(73) Assignee: Applied Materials, Inc., Santa Clara, CA (US)

( * ) Notice: Subject to any disclaimer, the term of this patent is extended or adjusted under 35 U.S.C. 154(b) by 739 days.

(21) Appl. No.: 12/948,164

(22) Filed: Nov. 17, 2010

(65) Prior Publication Data

US 2011/0135844 A1 Jun. 9, 2011

Related U.S. Application Data (60) Provisional application No. 61/262,096, filed on Nov. 17, 2009.

(51) Int. Cl.
*C23C 16/505* (2006.01)
*H01L 21/3065* (2006.01)

(52) U.S. Cl.
USPC .................................. 156/345.44; 118/723 E (58) Field of Classification Search
CPC ...................... H01J 37/32091; H01J 37/32568; H01J 37/32577; H01J 37/32174; H01J 37/32532; H01J 37/32183
USPC ..................................................... 156/345.44
See application file for complete search history.

(56) References Cited

U.S. PATENT DOCUMENTS

| | | | |
|---|---|---|---|
| 6,477,980 B1 * | 11/2002 | White et al. | 118/723 E |
| 6,753,689 B1 | 6/2004 | Thomas | |
| 2002/0046989 A1 * | 4/2002 | Blonigan et al. | 219/121.43 |
| 2005/0251990 A1 * | 11/2005 | Choi et al. | 29/558 |
| 2006/0060138 A1 * | 3/2006 | Keller et al. | 118/715 |
| 2008/0268173 A1 * | 10/2008 | White et al. | 427/570 |

FOREIGN PATENT DOCUMENTS

| | | |
|---|---|---|
| JP | 08-088097 A | 4/1996 |
| KR | 20030043669 A | 6/2003 |
| KR | 20070112662 A | 11/2007 |

OTHER PUBLICATIONS

PCT international search report and written opinion of PCT/US2010/056946 dated Jul. 18, 2011.

\* cited by examiner

*Primary Examiner* — Maureen Gramaglia
(74) *Attorney, Agent, or Firm* — Patterson & Sheridan, LLP (57) ABSTRACT

A plasma processing system having at-electrode RF matching and a method for processing substrates utilizing the same is provided. In one embodiment, the plasma processing system includes a chamber body, the substrate support, an electrode, a lid assembly and an RF tuning element. A substrate support is disposed in a processing volume defined in the chamber body. The electrode is positioned above the substrate support and below a cover of the lid assembly. The RF tuning element is disposed between the cover and the electrode and is coupled to the electrode.

5 Claims, 6 Drawing Sheets

LARGE AREA PLASMA PROCESSING CHAMBER WITH AT-ELECTRODE RF MATCHING

CROSS REFERENCE TO RELATED APPLICATIONS

This application claims benefit of U.S. Provisional Patent Application Ser. No. 61/262,096, filed Nov. 17, 2009, which is incorporated by reference in its entirety.

BACKGROUND OF THE INVENTION

1. Field of the Invention

The embodiments of the invention generally relate to a method and apparatus for plasma processing a substrate, and more specifically, a plasma processing system having at-electrode RF matching, and a method for processing a substrate using the same.

2. Description of the Related Art

Large area substrates are often utilized in the manufacture of solar cells and liquid crystal displays. Liquid crystal displays (LCDs) or flat panels are commonly used for active matrix displays such as computers, touch panel devices, personal digital assistances (PDAs), cell phones, television monitors, and the like. Further, organic light emitting diodes (OLEDs) have also been widely used for flat panel displays. Generally, flat panels comprise two plates having a layer of liquid crystal material sandwiched therebetween. At least one of the plates includes at least one conductive film disposed thereon that is coupled to a power source. Power, supplied to the conductive film from the power supply, changes the orientation of the crystal material, creating a patterned display.

Solar cells may be formed from crystalline material or from amorphous or micro-crystalline materials. Generally, there are two major types of solar cells that are produced in large quantities today, which are crystalline silicon solar cells and thin film solar cells. Crystalline silicon solar cells typically use either mono-crystalline substrates (i.e., single-crystal substrates of pure silicon) or a multi-crystalline silicon substrates (i.e., poly-crystalline or polysilicon). Additional film layers are deposited onto the silicon substrates to improve light capture, form the electrical circuits, and protect the devices. Suitable substrates include glass, metal, and polymer substrates. Thin film silicon solar cells have gained a significant market share due to low-cost, large-area deposition of the amorphous-microcrystalline silicon absorber layers. Thin-film solar cells use thin layers of materials deposited on suitable substrates to form one or more p-n junctions, which facilitate current flow within the cell when exposed to light.

In order to manufacture these displays and solar cells, a substrate, such as a glass or polymer workpiece, is typically subjected to a plurality of sequential processes to create devices, conductors and insulators on the substrate. Each of these processes is generally performed in a process chamber configured to perform a single step of the production process. In order to efficiently complete the entire sequence of processing steps, a number of process chambers are typically coupled to a transfer chamber that houses a robot to facilitate transfer of the substrate between the process chambers. One example of a processing platform having this configuration is generally known as a cluster tool, examples of which are the families of AKT plasma enhanced chemical vapor deposing (PECVD) processing platforms available from AKT America, Inc., of Santa Clara, Calif.

As demand for flat panels and solar cells has increased, so has the demand for larger sized substrates. For example, large area substrates utilized for flat panel fabrication have increased in area from 550 mm by 650 mm to over 4 square meters in just a few years and are envisioned to continue to increase in size in the near future. This growth in the size of the large area substrates has presented new challenges in handling and production. For example, the larger surface area of the substrates has resulted in increased RF power requirements, which in turn, has increased the size and cost of RF power transmission components. Since the equipments size and power consumption of processing equipment suitable for large area substrates and conventional semiconductor wafers differ by orders of magnitude, mere scale-up of conventional solutions does not provide acceptable or in some cases even predictable results, thus demanding new innovations to enable next generation process and equipment.

Therefore, there is a need for an improved plasma processing system suitable for processing large area substrates.

SUMMARY OF THE INVENTION

A plasma processing system having at-electrode RF matching and a method for processing a substrate using the same are provided. The at-electrode RF matching reduces the footprint required by the plasma processing system, as RF matching circuits are no longer required outside of the processing system. Moreover, at-electrode RF matching allows positioning of RF transmission drives far off-set from the center of the processing system, thereby freeing the center of the processing chamber for other purposes.

In one embodiment, a plasma processing system having at-electrode RF matching includes a chamber body, a substrate support, an electrode, a lid assembly and an RF tuning element. The substrate support is disposed in a processing volume defined in the chamber body. The electrode is positioned adjacent, above or in front of the substrate support and below a cover of the lid assembly which is disposed over the lid assembly. The RF tuning element is disposed between the cover and the electrode and is coupled to the electrode.

In another embodiment, a plasma processing system having at-electrode RF matching includes a chamber body having a side wall, a bottom and a lid assembly defining a processing volume. A substrate support is disposed in the processing volume of the chamber body. A gas distribution plate is disposed above the substrate support. A backing plate is supported by the lid assembly and supports the gas distribution plate above the substrate support. The cover is disposed over the lid assembly covering the backing plate. An RF feed is coupled through the cover to an RF power source. A plurality of RF sub-feeds disposed between the cover and the backing plate are coupled to the RF feed by a splitter. The RF sub-feeds are coupled to the RF feed through the splitter. A plurality of capacitive and/or inductor load and phase tune elements are disposed between the cover plate and backing plate. Each of the plurality of load elements couples a respective one of the RF sub-feeds to the cover. A plurality of tuning elements are disposed between the cover and the backing plate, i.e., back side of the RF plasma-driving electrode. Each of the plurality of tuning elements couple a respective one of the RF sub-feeds to the backing plate not at the center of the backing plate. An RF-hot gas feedthrough may be provided through the cover and backing plate to provide gas into a plenum defined between the gas distribution plate and the backing plate.

In yet another embodiment of the invention, a method for processing a substrate in a processing system having at-electrode RF matching includes flowing a gas mixture containing one or more silicon-based gases into a processing volume through an RF gas feed-through and a gas distribution plate, providing RF power to the gas distribution plate through an at-electrode matching element to energize the gas mixture within the processing volume, and depositing a silicon layer on a substrate in the presence of the energized gas mixture.

BRIEF DESCRIPTION OF THE DRAWINGS

So that the manner in which the above recited features of the present invention are attained and can be understood in detail, a more particular description of the invention, briefly summarized above, may be had by reference to the embodiments thereof which are illustrated in the appended drawings.

To facilitate understanding, identical reference numerals have been used, where possible, to designate identical elements that are common to the figures. It is to be noted, however, that the appended drawings illustrate only typical embodiments of this invention and are therefore not to be considered limiting of its scope, for the invention may admit to other equally effective embodiments.

DETAILED DESCRIPTION

The invention generally relates to a plasma processing chamber having at-electrode RF matching and a method for processing a substrate utilizing the same. The plasma processing chamber is configured to process a large area substrate using plasma in forming structures and devices on the large area substrate for use in the fabrication of liquid crystal displays (LCD's), flat panel displays, organic light emitting diodes (OLED's), or photovoltaic cells for solar cell arrays, and the like. Although the invention is illustratively described, shown and practiced within the large area substrate processing system, the invention may find utility in other plasma processing chambers where it is desirable to utilized RF matching at or near electrodes utilized within the chamber for plasma generation. A distributed match network comprise of at or near electrode RF matching can be used to compensate for asymmetries in the load impedance distribution, e.g., the slit valve opening. The distributed match network substantially eliminates the asymmetry of the ground return path to the match box by lowering the current to an insignificant level in the high impedance "transmission lines" under the RF cover. That reduces $I^2R$ losses as well as negating the impact of asymmetric location of the RF generator connection point.

Figure 1:
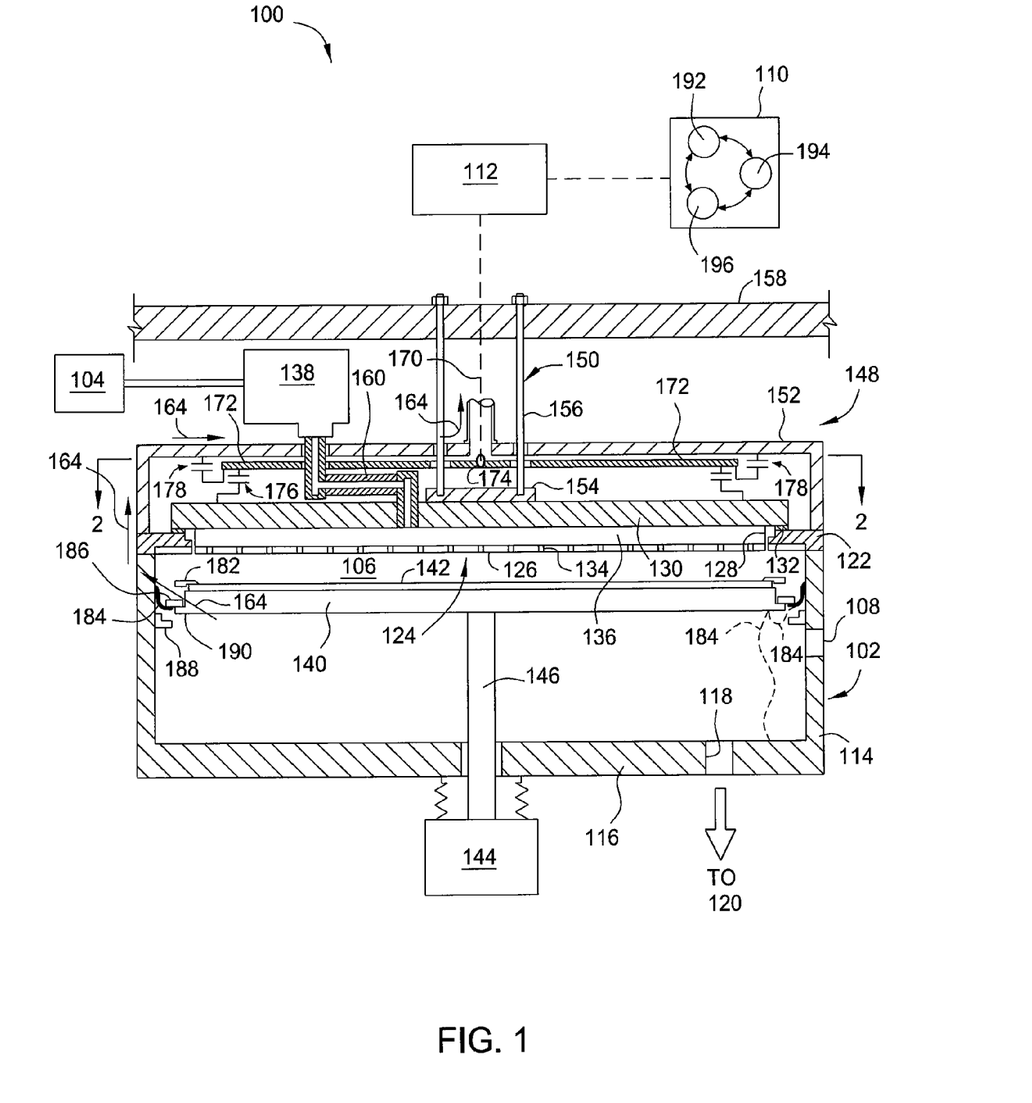
FIG. 1 is a cross sectional view of one embodiment of a plasma enhanced chemical vapor deposition system having at-electrode RF matching.

FIG. 1 is a cross sectional view of one embodiment of a plasma enhanced chemical vapor deposition system 100 having a processing chamber 148, RF generator (RF power source) 112, a gas source 104 and a controller 110. The controller 110 may be a general purpose or industrial computer suitable for controlling processes performed in the system 100. The controller 110 includes memory 192, support circuits 194 and a processor 196.

The processing chamber 148 includes a grounded chamber body 102 that is coupled to the RF generator (RF power source) 112, gas source 104 and controller 110. The chamber body 102 includes sidewalls 114, a bottom 116 and a lid assembly 122. The sidewalls 114 and bottom 116 of the chamber body 102 are typically fabricated from a unitary block of aluminum or other material compatible with process chemistries. The sidewalls 114, bottom 116 and lid assembly 122 bound a process volume 106. A pumping port 118 is formed through the chamber body 102 to allow a pumping system 120 to evacuate and control the pressure within the process volume 106.

A substrate support 140 is disposed in the process volume 106 to support a large area substrate 142 during processing. The substrate support 140 is coupled by a stem 146 to a lift mechanism 144. The lift mechanism 144 controls the elevation of the substrate support 140, for example, between an elevated processing position as shown in FIG. 1, and a lowered transfer position that is aligned with a slit valve passage 108 formed through the chamber body 102 to facility entry and egress of the substrate 142 from the process volume 106.

A shadow frame 182 is placed over a periphery of the substrate 142 when processing to prevent deposition on the edge of the substrate 142. In one embodiment, the shadow frame 182 may be fabricated by a metal material, a ceramic material, or other suitable material. In one embodiment, the shadow frame 182 is fabricated by a bare aluminum or a ceramic material.

A flexible RF return path 184 utilized as part of an RF current return loop that returns RF current back to the RF power source 112. The RF return path 184 may be fabricated from titanium, aluminum, stainless steel, beryllium copper, a material coated with a conductive metallic coating, or other suitable RF conducting material. The RF return path 184 may be evenly or randomly distributed along the respective sides of the substrate support 140. In one embodiment, the RF return path 184 is coupled between the substrate support 140 and the chamber body 102, such as a chamber sidewall 114. In another embodiment the RF return path 184 (shown in phantom) is coupled between the substrate support 140 and the chamber bottom 116 or sidewall 114.

In the embodiment depicted in FIG. 1, an outer end of the RF return path 184 is coupled to the chamber body 102. An inner end of the RF return path 184 is coupled to a ground frame 186 that rests on a lip 190 of the substrate support 140 when the substrate support 140 is in an elevated processing position as shown in FIG. 1. The ground frame 186 is fabricated from a material such as aluminum that conducts RF between the substrate support and the chamber body 102. When the substrate support 140 is lowered to the transfer position, the ground frame 186 contacts a frame support 188 coupled to the sidewall 114 of the chamber body 102 which lifts the ground frame 186 off the lip 190. As the substrate support 140 continues downward, the shadow frame 182 contacts the ground frame 186 which lifts the shadow frame 182 from the substrate 142 to facilitate substrate transfer.

A showerhead assembly 124 is supported by the lid assembly 122 above the substrate support 140. An RF conductive cover 152 is disposed on the lid assembly 122 to cover the showerhead assembly 124. The cover 152 is electrically connected to the grounded chamber body 102 through the lid assembly 122. The showerhead assembly 124 includes a gas distribution plate 126 supported by a suspension 128 from a backing plate 130. The showerhead assembly 124 is electrically isolated from the lid assembly 122 by an isolator 132.

In one embodiment, the gas distribution plate 126 and the backing plate 130 have a substantially rectangular surface facing the substrate support 140. The gas distribution plate 126 and the backing plate 130 are typically sized about the same size as the substrate support 140.

The gas distribution plate 126 includes a plurality of holes 134 that direct process and other gases towards the substrate 142 positioned on the substrate support 140. Examples of gas distribution plates that may be adapted to benefit from the invention disclosed in U.S. Pat. No. 6,477,980 issued on Nov. 12, 2002 to White, et al., U.S. Publication No. 20050251990 published on Nov. 17, 2005 to Choi, et al., and U.S. Publication No. 2006/0060138 published on Mar. 23, 2006 to Keller, et al, all of which are incorporated by reference in their entirety.

A plenum 136 is defined between the gas distribution plate 126 and the backing plate 130. Processing and/or cleaning gases are delivered from the gas source 104 through the backing plate 130 and into the plenum 136 using an RF gas feed-through 160. A remote plasma source 138 may be coupled in-line between the gas source 104 and the RF gas feed-through 160 to dissociate gases prior to entering the plenum 136.

In one embodiment, the remote plasma source 138 may be utilized to energized a cleaning gas to remotely provide plasma utilized to clean chamber components. The cleaning gas may be further excited by the RF power provided to the backing plate 130 and/or gas distribution plate 126 by the RF power source 112. Suitable cleaning gases include, but are not limited to, $NF_3$, $F_2$, and $SF_6$. Examples of remote plasma sources are disclosed in U.S. Pat. No. 5,788,778 issued Aug. 4, 1998 to Shang et al, which is incorporated by reference.

A support structure 150 couples the center of the backing plate 130 to an overhead beam 158 disposed above the chamber body 102. The overhead beam 158 may be supported by the facility building structure, by the chamber body 102 or other suitable structure. The support structure 150 is adjustable so that the elevation of the center of the backing plate 130 may be adjusted, which in turn, control the shape or profile of the gas distribution plate 126. In one embodiment, the support structure 150 includes a ring 154 coupled to the center of the backing plate 130 by fasteners 202 (shown in FIG. 2). A plurality of studs 156 couple the ring 154 to the overhead beam 158. The studs 156 may be adjusted as desired to control the distance between the backing plate 130 and the overhead beam 158. The studs 156 and/or ring 154 are coupled to the backing plate 130 in a manner that prevents RF conductance between the backing plate 130 and the overhead beam 158 or the cover 152. A more detailed description of support structure that may be adapted to benefit from the invention is described in U.S. patent application Ser. No. 12/037,885, filed Feb. 26, 2008, which is incorporated by reference in its entirety.

The RF power source 112 is coupled to an electrode at the top of the system 100, such as a backing plate 130 and/or gas distribution plate 126, to provide a RF power to create an electric field between the gas distribution plate 126 and the substrate support 140. Alternatively, the electrode may be located adjacent, above or in front of the substrate. The electric field generates a plasma from the gases present between the gas distribution plate 126 and the substrate support 140 which are utilized to process the substrate disposed in the substrate support 140.

In the embodiment depicted in FIG. 1, an RF feed 170, such as an approximately 50 ohm RF transmission line, for example a coaxial cable, is coupled to the RF power source 112. The RF feed 170 is routed through the cover 152 to an RF splitter 174. A plurality of RF sub-feeds 172 route the power from the RF feed 170 to various locations on the electrode. In the embodiment depicted in FIG. 1, the end of each RF sub-feed 172 opposite the splitter 174 is coupled to the backing plate 130 by an at-electrode tuning element 176 and to the cover 152 by a load element 178. In embodiments wherein the electrode does not include a backing plate, the transmission lines may be coupled to the corresponding portions of the gas distribution plate as described below with reference to the backing plate. The number and locations of the RF sub-feeds 172 may be selected based on chamber geometry and power requirements. In one embodiment, the RF sub-feed 172 is coupled proximate to a perimeter of the backing plate 130 by the tuning element 176, leaving the center of the backing plate 130 available for mounting of the ring 154, studs 156 and RF gas feed-through 160.

Figure 2:
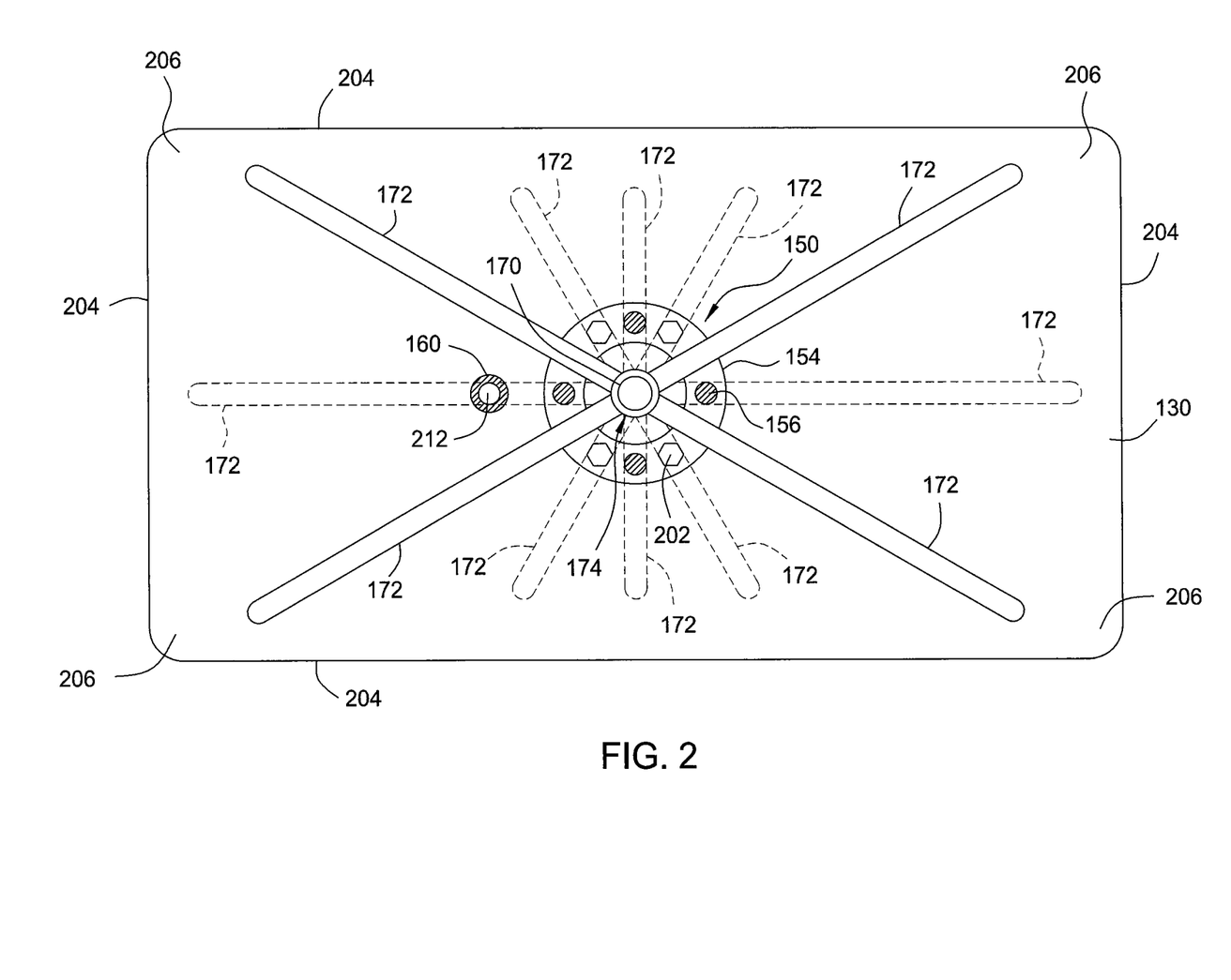
FIG. 2 is a cross sectional view of the plasma enhanced chemical vapor deposition system of FIG. 1 taken long section lines 2-2.

In the embodiment depicted in FIG. 1 and further illustrated in the sectional view FIG. 2, four RF sub-feeds 172 are utilized. The four RF sub-feeds 172 may each be an approximately 200 ohm transmission line, such as a coaxial cable or other suitable RF conductor. The RF sub-feeds 172 pass between the studs 156. The studs 156 may be repositioned as desired to allow different routing of the RF sub-feeds 172. For example as additionally illustrated in FIG. 2, additional RF sub-feeds 172 (as shown in phantom) may be utilized, such as 6 RF sub-feeds, 8 RF sub-feeds or other number of RF sub-feeds. The impedance at the single connection point of the RF feed 170 is selected to match the output impedance of the RF power supply. For most industrial applications that is 50 ohms resistive, and therefore the sum of the impedances of all the sub-feeds emanating from the 50 ohm point must also be 50 ohm in order to have efficient energy transfer from the power supply to the load.

Figure 3:
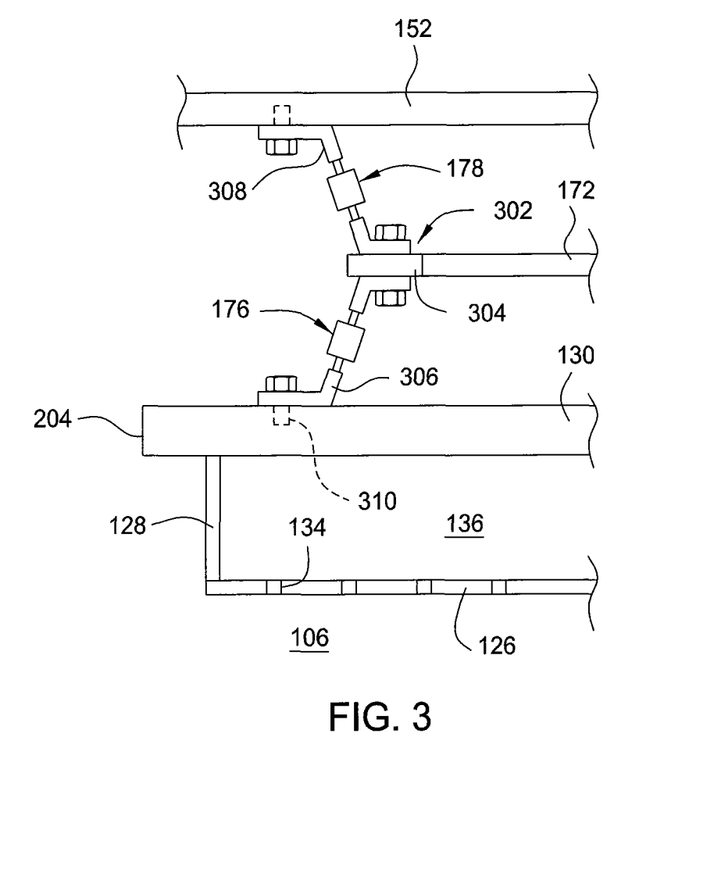
FIG. 3 is a partial sectional view of the plasma enhanced chemical vapor deposition system of FIG. 1.

Referring now to FIG. 3, a distal end 302 of each RF sub-feed 172 includes a terminal 304. The terminal 304 facilitates coupling the tuning element 176 and the load element 178 to the RF sub-feed 172. The tuning element 176 includes a terminal 306 for electrically coupling the RF sub-feed 172 to a contact point 310 formed in the electrode, such as the backing plate 130 depicted in FIGS. 2 and 3. The load element 178 includes a terminal 308 for electrically coupling the RF sub-feed 172 to the cover 152, as shown in FIG. 3, or to one of the chamber sidewalls 114 or lid assembly 122.

In one embodiment, the contact point 310 is a threaded hole. The contact point 310 is generally located proximate a side 204 of the electrode (but in any case away from the center), such as the backing plate 130 depicted in FIGS. 2 and 3. In one embodiment, at least four of the contact points 310 are located proximate a respective corner 206 of the backing plate 130.

The RF gas feed-through 160 is coupled to a port 212 formed through the backing plate 130. The port 212 may be positioned offset from the center of the backing plate 130 to allow the studs 156 and ring 154 to be mounted to the center of the backing plate 130 for better backing plate and/or gas distribution plate profile control. The port 212 is formed proximate to the center of the backing plate 130 and adjacent the ring 154 to space the port 212 from the contact point 310. By positioning the port 212 and RF gas feed-through 160 spaced from the contact points 310 of the RF sub-feeds 172, the voltage which "appears" at the port 212 may be minimized as to reduce potential for creating a premature or parasitic discharge in the RF gas feed-through 160.

During processing, RF power from the RF power source 112 is delivered to the electrode through the RF feed 170, plurality of RF sub-feeds 172 and tuning element 176 to generate a plasma and/or excite gases in the process volume 106 between the gas distribution plate 126 and the substrate support 140. RF power is returned to the RF power source 112 from the substrate support 140 through the ground frame 186, RF return paths 184, chamber sidewalls 114, lid assembly 122, cover 152 and RF feed 170, as shown by arrows 164. Since the tuning elements 176 are on the RF delivery path, the RF current returning to the RF power source 112 does not pass the tuning elements 176 or matching box present in conventional systems. The phase (tune) and magnitude (load) of the total chamber RF load may be adjusted as desired by use of at-electrode capacitors and/or inductors. Positioning the tuning element 176 below the cover 152 at the electrode advantageously provides flexibility for the location of the RF transmission lines which frees up the center of the processing chamber 148 such that connection point of the RF feed 170 may be located far off center and out of the way of other components positioned on the chamber lid assembly 122. Additionally, positioning the tuning element 176 at the electrode and away from the center, places the RF matching elements at the ends of much higher impedance parallel transmission line sub-feeds, thus reducing current capacity requirements of the sub-feeds and dramatically reducing the voltage stress on the transmission lines and circuit elements and providing a cost reduction over centrally-positioned, high-voltage single matching circuit systems. Additionally, having multiple at-electrode matching circuits allows for localized regional tuning of the electrode, which is not possible using only a single tuning conventional tuning circuit for the entire processing system. This allows greater control and fine tuning of the RF excitation. The tuning element 176 may be selected to perform fixed or dynamic RF matching. For example as further discussed below, the tuning element 176 and/or impedance of various portions of the RF transmission lines may be selected to either maintain an electrically symmetric drive to the electrode, or alternatively to drive the electrode it differently at opposite ends and/or converse in order to compensate for a preexisting asymmetry in the processing chamber design.

Fixed RF Matching

In one embodiment, the tuning element 176 is a fixed capacitor or inductor. In such embodiments, the RF power source 112 is a variable frequency power source. In one embodiment, the output of the RF power source 112 may be varied between about 0.3 MHz and about 200 MHz in response to a characteristic of the plasma, which causes reflected RF power to increase or decrease. In one embodiment the RF power source 112 provides RF power which is varied about an average frequency of 13.56 MHz.

The load element 178 may be selected to match the characteristic impedance of the RF transmission lines to at least a portion of the load. In one embodiment, the load element 178 is a capacitor having a fixed capacitance value. In another embodiment, the load element 178 is an inductor having a fixed inductance value. In another embodiment, the load element 178 is a capacitor-inductor network having a fixed impedance value.

The capacitance of the tuning element 176 may be selected to provide a desired resonant behavior of the electrode, thereby providing peak RF transmission at a desired RF frequency. In one embodiment, the tuning element 176 is a capacitor having a fixed capacitance value. In another embodiment, the tune element 176 is an inductor having a fixed inductance value. In another embodiment, the tune element 176 is a capacitor-inductor network having a fixed impedance value.

Dynamic RF Matching

In one embodiment, the tuning element 176 has both inductance and capacitance elements, at least one of which is adjustable as to operate as an RF matching circuit to tune the resonance of the electrode to match that of the plasma load. In such embodiments, the RF power source 112 may be one or more fixed frequency power sources. The RF power source (or sources) 112 may provide RF power at one or more frequencies. The one or more frequencies may be selected between about 0.3 MHz and about 200 MHz. In one embodiment the RF power source 112 provides RF power at a frequency of 13.56 MHz. The inductance and/or capacitance value of the tuning element 176 may be varied in response to plasma characteristic information In one embodiment, the at-electrode tuning elements 176 may be dynamically varied independently from one another.

The capacitance of the tuning element 176 may be selectively varied in response to plasma characteristic information to provide a desired resonant behavior of the electrode, thereby providing peak RF transmission at a desired RF frequency. In one embodiment, the tuning element 176 is a capacitor having a variable capacitance value which may be selected in response to the plasma characteristic information. In another embodiment, the tune element 176 is an inductor having a variable inductance value which may be selected in response to the plasma characteristic information. In another embodiment, the tune element 176 is a capacitor-inductor network having a variable impedance value and/or capacitance value which may be selected in response to the plasma characteristic information.

The load element 178 may be selected to match the characteristic impedance of the RF transmission lines to at least a portion of the load. In one embodiment, the load element 178 is a capacitor having a fixed capacitance value. In another embodiment, the load element 178 is an inductor having a fixed inductance value. In another embodiment, the load element 178 is a capacitor-inductor network having a fixed impedance value In Operation In operation, the plasma processing system having at-electrode RF matching may be utilized to deposit a silicon-based film suitable for TFT or solar devices. In one embodiment, an amorphous silicon layer may be formed on a substrate disposed on the substrate support in the plasma processing system. A gas mixture containing one or more silicon-based gases is provided into the processing volume through the RF gas feed-through and gas distribution plate. RF power from the RF power source is provided to the electrode through the at-electrode tuning elements to energized gases within the process volume. Suitable silicon-based gases include, but are not limited to silane ($SiH_4$), disilane ($Si_2H_6$), silicon tetrafluoride ($SiF_4$), silicon tetrachloride ($SiCl_4$), dichlorosilane ($SiH_2Cl_2$), and combinations thereof. In one embodiment, is silane ($SiH_4$) gas is used as the silicon-based gas.

Hydrogen-based gases may also be provided during processing. Suitable hydrogen-based gases include, but are not limited to hydrogen gas ($H_2$). In one embodiment, the gas mixture is provided having hydrogen gas to silane gas in ratio by volume between about 4:1 and about 25:1. In one embodiment, the hydrogen gas is supplied by volume between about 14.28 sccm/L and about 71.42 sccm/L. The silicon based gas is supplied by volume between about 0.74 sccm/L and about 10.71 sccm/L.

Process parameters may be controlled while forming the amorphous silicon layer. In one embodiment, the RF power provided through the tuning elements may be controlled between about 20 milliWatts/$cm^2$ and about 500 milliWatts/$cm^2$ to the backing plate and/or gas distribution plate, wherein the area is the area of the gas distribution plate facing the substrate. The pressure of the chamber may be maintained between about 1 Torr and about 100 Torr, for example, between about 1 Torr and about 20 Torr. The spacing is controlled between about 600 mils and about 900 mils and the substrate temperature is controlled between about 100 degrees Celsius and about 400 degrees Celsius, such as about 200 degrees Celsius.

In one embodiment, the frequency of the RF output of the RF power source may be varied based on an actively measured characteristic of the match condition of chamber and plasma load to the output of the RF supply. In another embodiment, the at-electrode tuning elements may be dynamically varied in either capacitance and/or inductance based on an actively-measured characteristic of match condition of chamber and plasma load to the output of the RF supply. The at-electrode tuning elements may be dynamically varied independently from one another.

Alternative Transmission Line Layouts

Figure 4:
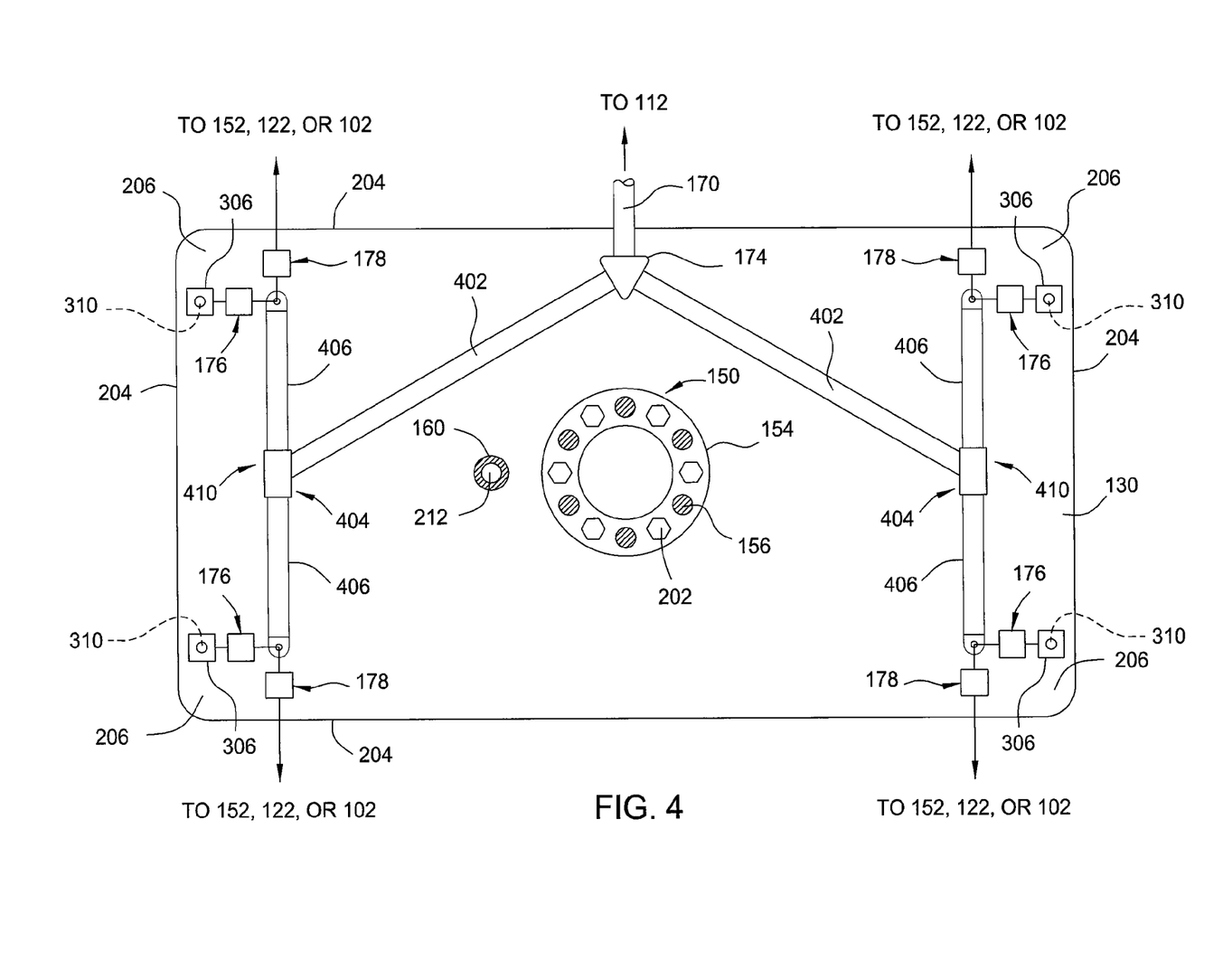
FIGS. 4-6 are partial cross sectional view of a plasma enhanced chemical vapor deposition system illustrating various layouts for power transmission lines.
Figure 5:
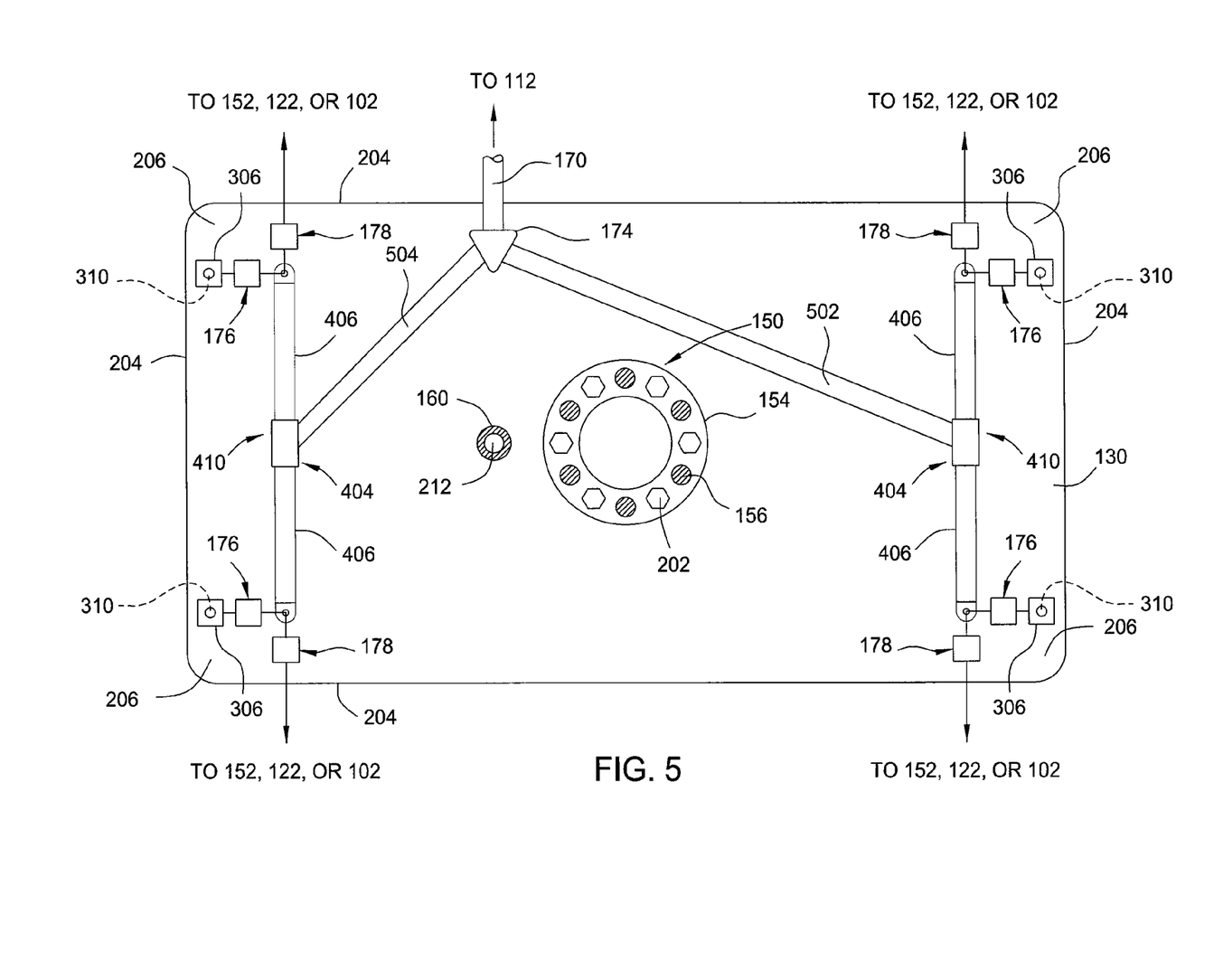
Figure 6:
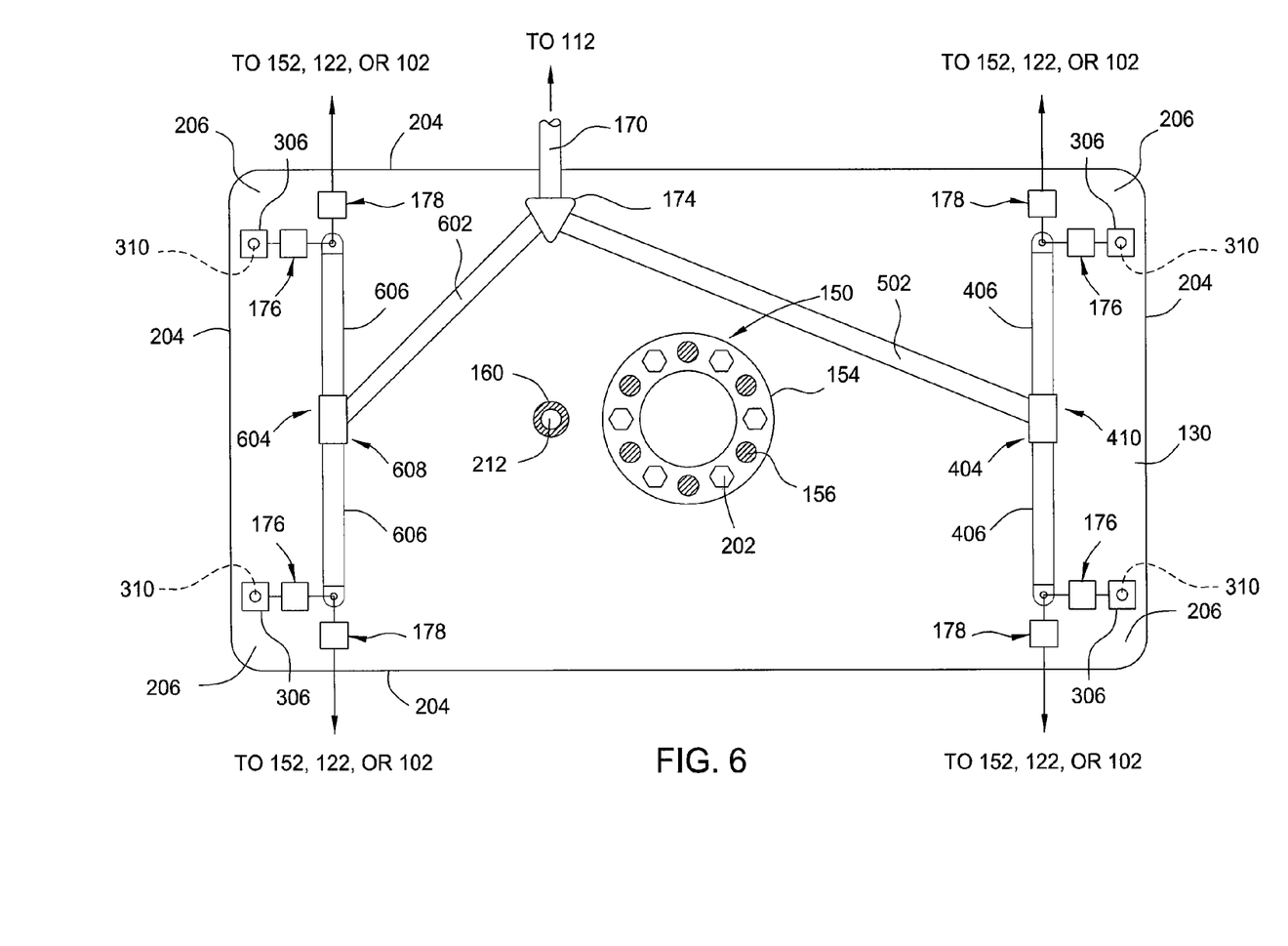

FIGS. 4-6 depict are partial cross sectional view of a plasma enhanced chemical vapor deposition system illustrating various layouts for power transmission lines. The embodiments of FIGS. 4-6 have the same viewpoint of the system as FIG. 2, looking down at the backing plate 130 from under the cover 152. Although three alternative layouts are depicted, the other layouts are contemplated utilizing the teachings herein that maintain the center of the processing chamber clear of transmission line components and/or provide asymmetrical RF power drive to the electrode.

FIG. 4 is one embodiment of a transmission line layout for a plasma enhanced chemical vapor deposition system, such as the system 100 described above. The layout may also be utilized for other plasma processing systems. Transmission line layout of FIG. 4 includes an RF feed 170 extending from an RF power source 112 to an RF splitter 174. The RF splitter 174 is positioned offset from the center of the processing chamber 148. For reference, the center of the processing chamber 148 is aligned with the center of the backing plate 130, such that the splitter 174 is closer to one side 204 than the other sides 204 of the backing plate 130 and gas distribution plate 126. In the embodiment depicted in FIG. 4, the RF splitter 174 is positioned closer to one of the long sides 204 of the backing plate 130, while being substantially equidistant from the two shorter sides 204 of the backing plate 130.

A plurality of RF sub-feeds 402 are coupled to the splitter 174 at one end and to a secondary splitter 404 at a second end. Each of the secondary splitters 404 are coupled to a plurality of secondary RF sub-feeds 406. Each of the secondary RF sub-feeds 406 are coupled at a distal part opposite the secondary splitter 404 to an at-electrode tuning element 176 and a load element 178.

In the embodiment depicted in FIG. 4, each group of secondary sub-feeds 406 and associated secondary splitter 404 comprise a RF transmission line branch 410. The total impedance of each associated the sub-feed 402 and RF transmission line branch 410 may be equal to balance the distribution of RF power to the tuning elements 176. The impedance of the tuning elements 176, in the embodiment of FIG. 4 may be equal or different, to respectively provide symmetrical or asymmetrical power delivery as desired. The offset positioning of the splitter 174 and the RF feed 170 and RF sub-feeds 402 provides an open area at the center of the processing chamber 148 to facility delivery of gases, portions of the support structure 150 or other support of the backing plate 130/gas distribution plate 126 or other need.

In the embodiment depicted in FIG. 4, the transmission lines (i.e., the RF feed 170, the RF sub-feeds 402 and the secondary RF sub-feeds 406) are selected to provide an electrically symmetric drive to the electrode. In this particular embodiment, the RF feed 170 has a 50 ohm impedance, the two RF sub-feeds 402 respectively have a 100 ohm impedance, and the four secondary RF sub-feeds 406 respectively have a 200 ohm impedance. It is contemplated that the impedance of the transmission lines may be selected commensurate with the number of RF sub-feeds 402 and RF sub-feeds 406 utilized in a particular configuration.

FIG. 5 depicts an embodiment wherein the transmission lines positioned offset from the center of the processing chamber 148 in two perpendicular Cartesian coordinate directions, i.e., 50 ohm point of the RF feed 170 (at the splitter 174) is closer to one corner 206 of the backing plate 130 than the other corners 206. The components of the transmission lines of the embodiment of FIG. 5 are configured such that the impedance of each section of the transmission line can be selected such that the 50 ohm point of the RF feed 170 (at the splitter 174) may be placed in any desired position offset from the center while still providing a symmetrical RF drive to the backing plate 130.

In one embodiment, the transmission lines include a plurality of RF sub-feeds each coupled to at least one RF transmission line branch 410. In the embodiment depicted in FIG. 5, RF sub-feeds 502, 504 are shown, wherein the sub-feed 502 has a different length, shape, size and/or dielectric material but same impedance as the sub-feed 504, for example 100 ohms.

Optionally, one or more of the RF transmission line branches 410 may be configured similar to the RF sub-feeds 502, 504, such that one of the secondary RF sub-feeds 406 has a different length, shape, size and/or dielectric material while having a different impedance relative to the other secondary RF sub-feeds 406 comprising the RF transmission line branch 410, thus allowing the secondary splitter 404 to be located closer to one corner 206 than the other corners 206, thus providing additional flexibility of transmission line routing to accommodate other chamber components.

FIG. 6 depicts an embodiment wherein the transmission lines positioned offset from the center of the processing chamber 148 in two perpendicular Cartesian coordinate directions, i.e., the 50 ohm point of the RF feed 170 is closer to one corner 206 of the backing plate 130 than the other corners 206 similar to the embodiment of FIG. 5, except wherein the components of the transmission lines are configured to provide an asymmetrical RF drive to the backing plate 130. In the embodiment depicted in FIG. 6, the components of the transmission lines after the 50 ohm point of the RF feed 170 (at the splitter 174) have an asymmetric transmission line impedance which are designed to impart an asymmetric power split to opposite sides 204 of the backing plate 130. The asymmetric power split may be selected to drive the electrode differently at opposite sides in order to compensate for a preexisting asymmetry in the design of the processing chamber 148, such as the position of the slit valve passage 108, RF gas feed-through 160, pumping port 118, source of non-uniform gas conductance around the substrate support 140, source of plasma asymmetry or other source of process non-uniformity.

In one embodiment, the impedance of each section of the transmission line can be selected such that the 50 ohm point of the RF feed 170 (at the splitter 174) may be placed in any desired position offset from the center while providing asymmetric power distribution to the electrode. For example, the transmission lines may include a plurality of RF sub-feeds each coupled to at least one RF transmission line branch 410. In the embodiment depicted in FIG. 6, RF sub-feeds 502, 602 are shown, wherein the sub-feed 502 has at least one of a different length, shape, size and/or dielectric material than the sub-feed 602, but sub-feeds 502, 602 also have a different impedance. For example but not by way of limitation, the sub-feed 502 may have an impedance of about 91.7 ohm while the sub-feed 602 may have an impedance of about 110 ohm. The impedances of the sub-feeds may be selected to provide a desired RF power drive asymmetry to compensate of chamber asymmetry or non-uniformity of processing results.

In the embodiment, the sub-feed 502 is coupled to a RF transmission line branch 410 while the sub-feed 602 is coupled to a RF transmission line branch 604. The RF transmission line branches 410, 604 may be configured to provide symmetrical power delivery relative to their respective secondary splitter 404, 608. For example, in the embodiment depicted in FIG. 6, the RF transmission line branch 410 includes two 183.4 ohm secondary sub-feeds 406 while the RF transmission line branch 604 includes two 220 ohm secondary sub-feeds 606.

Optionally, one or more of the RF transmission line branches 410, 604 may be configured such that one of the secondary RF sub-feeds 406, 606 has a different length, shape, size and/or dielectric material along with a different impedance relative to the other secondary RF sub-feeds 406, 606 comprising the respective RF transmission line branch 410, 604, thus allowing the secondary splitter 404, 608 to be located closer to one corner 206 than the other corners 206, thus providing additional flexibility of transmission line routing to accommodate other chamber components.

Conclusion

Thus, a method and apparatus having at-electrode RF matching for plasma processing system is provided. Advantageously, the electrode RF matching provides means of symmetrically or, by choice, asymmetrically but predictably applying RF power to a large area electrode, allowing the connection point of the RF power supply to the electrode to be physically off-center of the electrode, reduce the voltage and current stress on the conductors and electrical components of the impedance matching system, reduce voltage stress on the gas feedthrough of a showerhead electrode to avoid parasitic discharge and to physically adjust the return current path of the RF in the chamber body to compensate, as desired, for any extant asymmetries in the return current path. Furthermore, as the RF matching is split in parallel between the number of sub-feeds, the reduced voltage requirements of the matching elements provides a cost reduction over high voltage single matching circuit systems. Additionally, although the exemplary processing system is depicted with the substrate and electrode in a horizontal orientation, it is contemplate that the invention may be practiced utilizing a vertical orientation of electrode and/or substrate as well.

While the foregoing is directed to the preferred embodiment of the present invention, other and further embodiments of the invention may be devised without departing from the basic scope thereof, and the scope thereof is determined by the claims that follow.

What is claimed is:

1. A plasma processing system, comprising:
   a chamber body having a chamber sidewall, a bottom and a lid assembly supported by the chamber sidewall defining a processing volume;
   a substrate support disposed in the processing volume of the chamber body;
   a gas distribution plate disposed above the substrate support;
   a backing plate supported by the lid assembly, the backing plate supporting the gas distribution plate;
   a grounded cover disposed over the lid assembly and covering the backing plate;
   an RF power source;
   an RF feed coupled through the cover to the RF power source;
   a splitter disposed between the cover and the backing plate, the splitter coupled to the RF feed;
   a plurality of RF sub-feeds disposed between the cover and the backing plate; the plurality of RF sub-feeds coupled to the RF feed through the splitter;
   a plurality of capacitive load elements disposed between the cover and the backing plate, a respective one of the plurality of load elements coupling a respective one of the RF sub-feeds to the cover;
   a plurality of tuning elements disposed between the cover and the backing plate, a respective one of the plurality of tuning elements coupling a respective one of the RF sub-feeds to the backing plate; and
   an RF gas feed-through providing a gas conduit through the cover and into a plenum defined between the gas distribution plate and the backing plate.

2. The plasma processing system of claim 1, wherein the plurality of RF sub-feeds further comprises:
   four approximately 200 ohm transmission lines or some other combination of sub-feeds, which may be varied in quantity and individual impedance so as to present a standard approximately 50-ohm load impedance to the output of a RF power source.

3. The plasma processing system of claim 2, wherein the balance of the sub-feeds is not symmetric about the electrode.

4. The plasma processing system of claim 2, wherein the RF tuning elements are fixed capacitors and/or inductors.

5. The plasma processing system of claim 1, wherein each of the plurality of tuning elements further comprises:
   an adjustable capacitor and/or inductor.

* * * * *